United States Patent
Yun et al.

(10) Patent No.: US 10,104,776 B2
(45) Date of Patent: Oct. 16, 2018

(54) CHIP RESISTOR ELEMENT

(71) Applicant: SAMSUNG ELECTRO-MECHANICS CO., LTD., Suwon-si, Gyeonggi-do (KR)

(72) Inventors: Jang Seok Yun, Suwon-si (KR); Hyung Min Kim, Suwon-si (KR); Jin Man Han, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 1 day.

(21) Appl. No.: 15/341,070

(22) Filed: Nov. 2, 2016

(65) Prior Publication Data

US 2017/0202089 A1    Jul. 13, 2017

(30) Foreign Application Priority Data

Jan. 8, 2016 (KR) .................. 10-2016-0002698

(51) Int. Cl.
*H01C 1/02* (2006.01)
*H05K 1/18* (2006.01)
(Continued)

(52) U.S. Cl.
CPC .............. *H05K 1/181* (2013.01); *H01C 1/148* (2013.01); *H01C 7/001* (2013.01); *H01C 7/18* (2013.01);
(Continued)

(58) Field of Classification Search
CPC .......... H01C 1/148; H01C 7/001; H01C 7/18; H01C 17/006; H01C 17/02; H01C 17/28
(Continued)

(56) References Cited

U.S. PATENT DOCUMENTS 6,023,217 A  *  2/2000  Yamada ................. H01C 1/142
                                                      338/307
6,242,999 B1 *  6/2001  Nakayama ............... H01C 1/14
                                                      338/307
(Continued)

FOREIGN PATENT DOCUMENTS

CN       101840760 A       9/2010
CN       103258606 A       8/2013
(Continued)

OTHER PUBLICATIONS

Korean Office Action issued in corresponding Korean Patent Application No. 10-2016-0002698, dated Jan. 2, 2018, with English Translation.
(Continued)

*Primary Examiner* — Kyung Lee
(74) *Attorney, Agent, or Firm* — McDermott Will & Emery LLP

(57) ABSTRACT

A chip resistor element includes an insulating substrate, a resistor layer, first and second internal electrodes, a resistor protection layer, first and second electrode protection layers, and first and second external electrodes. The resistor layer is on the insulating substrate, the first and second internal electrodes are on respective sides of the resistor layer, and the resistor protection layer covers the resistor layer and extends onto portions of the internal electrodes. The first electrode protection layers are on the first and second internal electrodes so as to overlap with portions of the resistor protection layer and contain first conductive powder particles and resin, while the second electrode protection layers are disposed on the first electrode protection layers and contain second conductive powder particles and resin. A content of resin in the second electrode protection layer is lower than in the first electrode protection layer.

39 Claims, 8 Drawing Sheets

(51) Int. Cl.
- *H01C 1/148* (2006.01)
- *H01C 7/18* (2006.01)
- *H01C 17/00* (2006.01)
- *H01C 17/28* (2006.01)
- *H01C 7/00* (2006.01)
- *H01C 17/02* (2006.01)
- *H01C 1/01* (2006.01)
- *H01C 17/24* (2006.01)
- *H05K 3/34* (2006.01)

(52) U.S. Cl.
CPC ........... *H01C 17/006* (2013.01); *H01C 17/02* (2013.01); *H01C 17/28* (2013.01); *H01C 1/01* (2013.01); *H01C 17/24* (2013.01); *H05K 3/3442* (2013.01); *H05K 2201/10022* (2013.01); *Y02P 70/611* (2015.11)

(58) Field of Classification Search
USPC .......................................................... 338/226
See application file for complete search history.

(56) References Cited

U.S. PATENT DOCUMENTS

| | | | | |
|---|---|---|---|---|
| 7,782,173 | B2* | 8/2010 | Urano | H01C 1/012 338/307 |
| 9,245,672 | B2 | 1/2016 | Ohbayashi et al. | |
| 2004/0113127 | A1* | 6/2004 | Min | H01B 1/128 252/500 |
| 2004/0160303 | A1* | 8/2004 | Kuriyama | H01C 1/142 338/309 |
| 2004/0164841 | A1 | 8/2004 | Saito et al. | |
| 2004/0262712 | A1 | 12/2004 | Doi | |
| 2011/0057765 | A1 | 3/2011 | Ryu et al. | |
| 2013/0321121 | A1* | 12/2013 | Ohbayashi | H01C 1/14 338/307 |
| 2016/0247610 | A1* | 8/2016 | Shinoura | H01C 1/142 |

FOREIGN PATENT DOCUMENTS

| | | |
|---|---|---|
| CN | 103392212 A | 11/2013 |
| JP | H07-142203 A | 6/1995 |
| JP | 2001-148302 A | 5/2001 |
| JP | 2002184602 A | 6/2002 |
| JP | 2004-259864 A | 9/2004 |
| JP | 2008-135502 A | 6/2008 |
| JP | 2013-080952 A | 5/2013 |
| WO | 03/046934 A1 | 6/2003 |
| WO | 2008/109262 A1 | 9/2008 |

OTHER PUBLICATIONS

First Office Action in Chinese Patent Application No. 20161102764.1, dated Jul. 2, 2018 (English translation).

* cited by examiner

CHIP RESISTOR ELEMENT

CROSS-REFERENCE TO RELATED APPLICATION(S)

This application claims benefit of priority to Korean Patent Application No. 10-2016-0002698 filed on Jan. 8, 2016 in the Korean Intellectual Property Office, the disclosure of which is incorporated herein by reference in its entirety.

BACKGROUND

1. Field

The present disclosure relates to a chip resistor element.

2. Description of Related Art

In general, when a chip resistor element is used for a long period of time while exposed to an external environment, an undesired reaction may be generated in a component such as an internal electrode of the chip resistor element, such that reliability of the chip resistor element may be decreased or performance of the chip resistor element may be lost. For example, a metal such as silver (Ag), commonly used as a material of the internal electrode, may be easily sulfurized to form an undesirable reactant (for example, $Ag_2S$) and cause disconnections.

Conventionally, a method of replacing the internal electrode or forming a protection layer on the internal electrode has been suggested in order to solve these problems. However, in this method, it is difficult to secure a high level of conductivity, and plating properties may be degraded, such that a plating layer for an external electrode may not be properly formed or adhesion strength thereof with respect to a lower structure may be reduced, such that a problem such as delamination may occur.

SUMMARY

An aspect of the present disclosure may provide a chip resistor element having an electrode protection layer having an excellent plating property and strong adhesion to a lower structure.

According to an aspect of the present disclosure, a chip resistor element may include an insulating substrate, a resistor layer, first and second internal electrodes, a resistor protection layer, first and second electrode protection layers, and first and second external electrodes. The insulating substrate has first and second surfaces opposing each other. The resistor layer is disposed on the first surface of the insulating substrate. The first and second internal electrodes are disposed on respective sides of the resistor layer on the first surface of the insulating substrate and are connected to the resistor layer. The resistor protection layer covers the resistor layer and extends onto portions of the first and second internal electrodes. The first electrode protection layers are disposed on the first and second internal electrodes so as to be overlapped with portions of the resistor protection layer and contain first conductive powder particles and a resin. The second electrode protection layers are disposed on the first electrode protection layers and contain second conductive powder particles and a resin. A content of the resin in the second electrode protection layer is lower than a content of the resin in the first electrode protection layer. The first and second external electrodes are respectively disposed on the first and second internal electrodes so as to cover the second electrode protection layers, and are connected to the resistor protection layer.

The first electrode protection layers may contain the first conductive powder particles in a first weight ratio, and the second electrode protection layers may contain the second conductive powder particles in a second weight ratio greater than the first weight ratio.

The second conductive powder may have an average particle size larger than an average particle size (d50) of the first conductive powder.

The content of the resin in the first electrode protection layer may be in a range of 95 to 99 wt % of a total weight of the first electrode protection layer. In this case, the first conductive powder particles may contain 1 to 5 wt % of carbon nanotubes. The carbon nanotubes may have lengths of 5 μm to 20 μm and diameters of 3 nm to 20 nm.

The content of the resin in the second electrode protection layer may be in a range of 3 to 10 wt % of a total weight of the second electrode protection layer. In this case, the second conductive powder particles may include 90 to 97 wt % of CuNi alloy powder particles. The second conductive powder particles may further include carbon nanotubes.

According to another aspect of the present disclosure, a chip resistor element may include an insulating substrate, a resistor layer, first and second upper electrodes, a resistor protection layer, first and second side electrodes, first and second electrode protection layers, and first and second external electrodes. The resistor layer may be disposed on an upper surface of the insulating substrate. The first and second upper electrodes may be disposed on respective sides of the resistor layer on the upper surface of the insulating substrate and may be connected to the resistor layer. The resistor protection layer may cover the resistor layer and extend onto portions of the first and second upper electrodes. The first and second side electrodes may be disposed on respective side surfaces of the insulating substrate and may be respectively connected to the first and second upper electrodes. The first electrode protection layers may be disposed on the first and second upper electrodes so as to be overlapped on portions of the resistor protection layer and may contain first conductive powder particles and a resin. The second electrode protection layers may be disposed on the first electrode protection layers and may contain second conductive powder particles and a resin. A content of the resin in the second electrode protection layer may be lower than a content of the resin in the first electrode protection layer. The first and second external electrodes may respectively be disposed on the first and second side electrodes and may extend to cover the second electrode protection layers.

According to another aspect of the disclosure, a chip resistor element may include a resistor layer, an internal electrode, a resistor protection layer, an electrode protection layer, and an external electrode. The internal electrode may contact the resistor layer, and the resistor protection layer may be disposed on the resistor layer and contact the internal electrode. The electrode protection layer may be disposed on the internal electrode and contact the resistor protection layer. The external electrode may be disposed on the electrode protection layer. The electrode protection layer may include a first electrode protection layer disposed on the internal electrode and contacting the resistor protection layer, and a second electrode protection layer disposed on the first electrode protection layer and having the external electrode disposed thereon. Additionally, the first and second electrode protection layers may each include resin, and a content of resin in the first electrode protection layer may be higher than a content of resin in the second electrode protection layer.

According to a further aspect of the disclosure, a chip resistor element including an insulating substrate having a plurality of resistor parts arranged to be spaced apart from each other by a spacing distance on the insulating substrate.

According to another aspect of the invention, a method of forming a chip resistor element may include forming, on one surface of an insulating substrate, first and second internal electrodes that are spaced apart from each other by a gap. A resistor layer is formed on the one surface of the insulating substrate to extend across the gap between the first and second internal electrodes to contact the first and second internal electrodes. A resistor protection layer covering the resistor layer is formed, and electrode protection layers are formed on the first and second internal electrodes to contact the resistor protection layer. First and second external electrodes are then respectively formed on the first and second internal electrodes so as to cover the electrode protection layers and to contact the resistor protection layer. The forming the electrode protection layers includes forming first electrode protection layers on the first and second internal electrodes to contact the resistor protection layer, and forming second electrode protection layers on the first electrode protection layers to have the first and second external electrode disposed thereon. The first and second electrode protection layers are each formed to include resin, and a content of resin in the first electrode protection layer is higher than a content of resin in the second electrode protection layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments will be described in detail with reference to the accompanying drawings.

Figure 1:
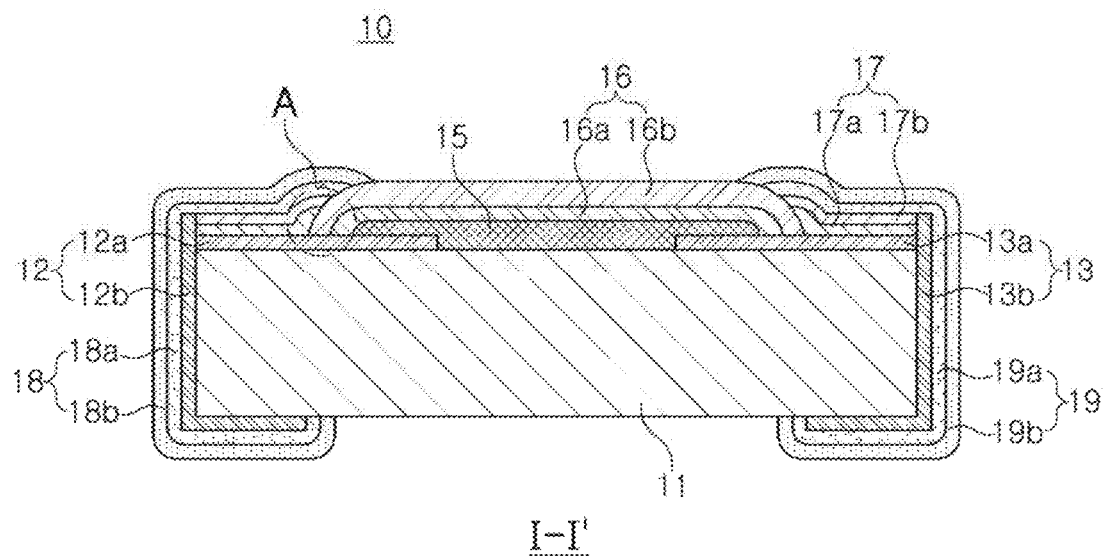
FIG. 1 is a side cross-sectional view illustrating a chip resistor element according to an exemplary embodiment.
Figure 2:
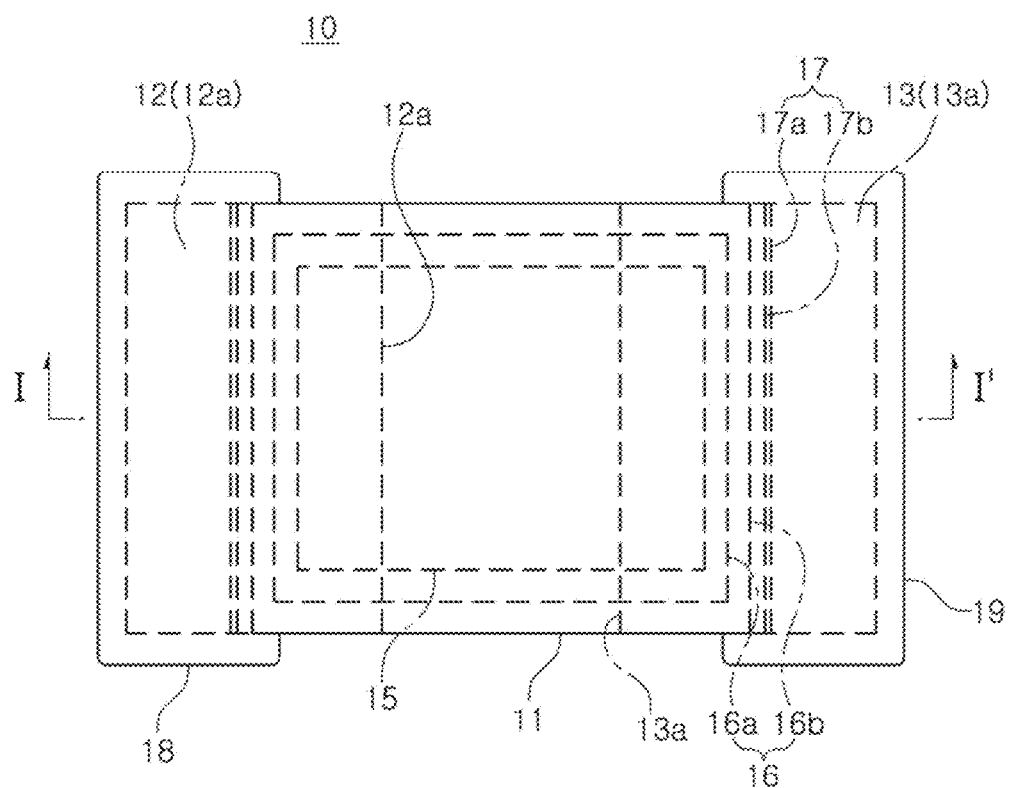
FIG. 2 is a plan view illustrating the chip resistor element of FIG. 1.

FIG. 1 is a side cross-sectional view illustrating a chip resistor element according to an exemplary embodiment; and FIG. 2 is a plan view illustrating the chip resistor element of FIG. 1.

Referring to FIGS. 1 and 2, a chip resistor element 10 according to the present exemplary embodiment may include an insulating substrate 11, a resistor layer 15, first and second internal electrodes 12 and 13, and first and second external electrodes 18 and 19. The chip resistor element 10 may further include a resistor protection layer 16 protecting the resistor layer 15 and electrode protection layers 17 protecting the first and second internal electrodes 12 and 13. In the illustrative example of FIG. 1, the first and second external electrodes 18 and 19 each have two layers, and thus respectively include first and second external electrode layers 18a, 18b, and 19a, 19b.

The insulating substrate 11 may have the resistor layer 15 disposed on one surface thereof. The insulating substrate 11 may support the resistor layer 15 that is relatively thin, and secure durability of the chip resistor element 10. The insulating substrate 11 may be formed of a material having excellent thermal conductivity. The insulating substrate 11 may effectively radiate heat, generated in the resistor layer 15 at the time of using the chip resistor element 10, to the outside. For example, the insulating substrate 11 may be formed of a ceramic material such as alumina ($Al_2O_3$) or a polymer material. In a specific example, the insulating substrate 11 may be an alumina substrate obtained by anodizing a surface of a thin plate-shaped piece of aluminum.

The first and second internal electrodes 12 and 13 may be disposed on respective sides of the resistor layer 15 on the one surface of the insulating substrate 11 having the resistor layer 15 thereon. Additionally, the first and second internal electrodes 12 and 13 may be disposed on respective opposing side surfaces of the insulating substrate 11 adjacent to the one surface having the resistor layer 15 thereon. The resistor layer 15 may be disposed on the one surface of the insulating substrate 11 so as to be connected to the first and second internal electrodes 12 and 13. As a material of the resistor layer 15, various metals or alloys, or a compound such as an oxide may be used. For example, the resistor layer 15 may contain at least one of a CuNi-based alloy, an NiCr-based alloy, an Ru oxide, an Si oxide, Mn, and a Mn-based alloy. The resistor layer 15 may be formed of a paste and be printed in a desired region.

The first and second internal electrodes 12 and 13 may be connected to the resistor layer 15, and may each include upper electrodes 12a and 13a disposed on an upper surface (also referred to as a 'first surface') of the insulating substrate 11. The upper surface of the insulating substrate 11 may correspond to the one surface having the resistor layer 15 disposed thereon. The first and second internal electrodes 12 and 13 may additionally be formed in regions in which the external electrodes 18 and 19 are to be formed, i.e., in regions in addition to the upper electrodes 12a and 13a. As in the present exemplary embodiment of FIG. 1, the first and second internal electrodes 12 and 13 may each include side electrodes 12b and 13b disposed on both side surfaces of the insulating substrate 11. As illustrated in FIG. 1, the side electrodes 12b and 13b may be extended onto a second surface of the insulating substrate 11 opposing the first surface of the insulating substrate 11.

The first and second internal electrodes 12 and 13 may be formed using a printing process (a process of printing and then sintering a conductive paste) or a depositing process using a conductive paste. The first and second internal electrodes 12 and 13 may be used as seeds in a plating process for forming the first and second external electrodes 18 and 19, respectively. For example, the first and second internal electrodes 12 and 13 may contain at least one of silver (Ag), copper (Cu), nickel (Ni), and platinum (Pt). The internal electrodes 12 and 13 may be formed of another material depending on positions in which they are formed, and different portions of the internal electrodes may be formed of different materials. For example, since the first and second upper electrodes 12a and 13a are directly connected to the resistor layer 15, they may contain a material having high conductivity, such as Ag, in order to secure high conductivity. The side electrodes 12b and 13b may contain a material such as Ni or Pd.

The resistor protection layer 16 may be disposed to cover the resistor 15 to protect the resistor layer 15 from external impacts, as illustrated in FIG. 2. For example, the resistor protection layer 16 may contain silicon ($SiO_2$), glass, or a polymer. In the present exemplary embodiment, the resistor protection layer 16, which has a two-layer structure, may include a first resistor protection layer 16a and a second resistor protection layer 16b that are sequentially stacked on the resistor layer 15. The first resistor protection layer 16a may be disposed before a trimming process to prevent damage generated in an undesired region due to a laser beam, or the like, in the trimming process. The second resistor protection layer 16b may be disposed after the trimming process to protect the resistor layer 15 from external impacts during use of the chip resistor element. For example, the first resistor protection layer 16a may contain a glass-based material, and the second resistor protection layer 16b may contain a resin, which is a polymer.

As illustrated in FIGS. 1 and 2, the electrode protection layers 17 may be disposed on the first and second internal electrodes 12 and 13 so as to be overlapped with portions of the resistor protection layers 16. The electrode protection layers 17 may serve to protect the first and second internal electrodes 12 and 13 from damage due to exposure of the first and second internal electrodes 12 and 13 to the outside. For example, the upper electrodes 12a and 13a of the first and second internal electrodes 12 and 13 may contain Ag. Therefore, if the upper electrodes 12a and 13a of the first and second internal electrodes 12 and 13 contact sulfur (S) in external air, a sulfide such as $Ag_2S$ may be easily formed. As a result, a serious defect such as disconnection may occur in the first and second internal electrodes 12 and 13.

The electrode protection layers 17 used in the present exemplary embodiment may have a two-layer structure. The electrode protection layers 17 may include first electrode protection layers 17a disposed on the first and second internal electrodes 12 and 13 and second electrode protection layers 17b disposed on the first electrode protection layers 17a. The first and second electrode protection layers 17a and 17b may be formed of resins containing first and second conductive powder particles, respectively, and contents of resins in the first and second electrode protection layers 17a and 17b may be different from each other. In detail, a content of the resin in the second electrode protection layer 17b may be lower than that of the resin in the first electrode protection layer 17a.

The electrode protection layers 17 are provided as a portion of an electrode. Therefore, the electrode protection layers 17 need to have sufficient conductivity. Further, the electrode protection layers 17 can be firmly coupled to layers (e.g., the internal electrodes 12 and 13 and the resistor protection layer 16) positioned below the electrode protection layers 17. Also, the electrode protection layers 17 can provide a surface having an excellent plating property in order to form the first and second external electrodes 18 and 19 thereon.

Since a content of the resin in the first electrode protection layer 17a is relatively high, adhesion between the first electrode protection layer 17a and the resistor protection layer 16 having a material (for example, a resin) similar to that of the first electrode protection layer 17a may be high. Therefore, the first electrode protection layers 17a may effectively block permeation paths from portions A adjacent to interfaces between the first electrode protection layers 17a and the resistor protection layer 16, thereby effectively protecting the first and second internal electrodes 12 and 13.

A content of the resin in the second electrode protection layer 17b may be relatively low, and a content of conductive powder particles in the second electrode protection layer 17b may be high. Therefore, a plating process for the first and second external electrodes 18 and 19 that will be positioned on the second electrode protection layers 17b may be smoothly performed. In one example, each of the first and second external electrodes 18 and 19 includes a first plating layer (e.g., 18a and 19a) containing nickel (Ni) and a second plating layer (e.g., 18b and 19b) disposed on the respective first plating layer and containing at least one of Sn and Pb.

As described above, the electrode protection layer 17 used in the present exemplary embodiment is divided into at least two layers, and contents of resins (or contents of conductive powder particles) in the respective layers are different from each other, whereby different characteristics (for example, adhesion and plating properties) or opposite characteristics may be simultaneously satisfied.

Figure 3A:
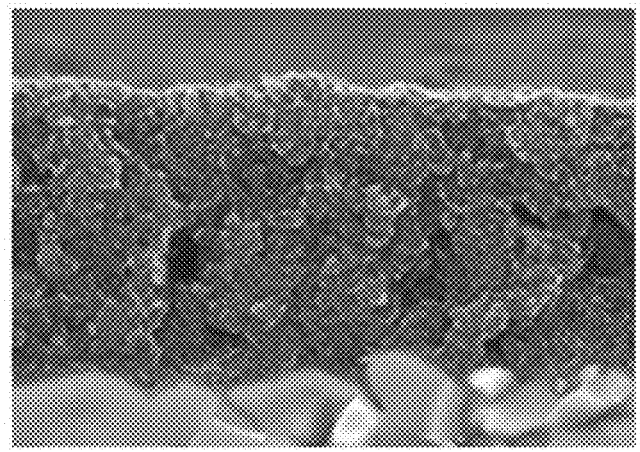
FIGS. 3A and 3B are, respectively, a scanning electron microscope (SEM) photograph and a schematic view illustrating a first electrode protection layer that may be used in the chip resistor element according to an exemplary embodiment.
Figure 3B:
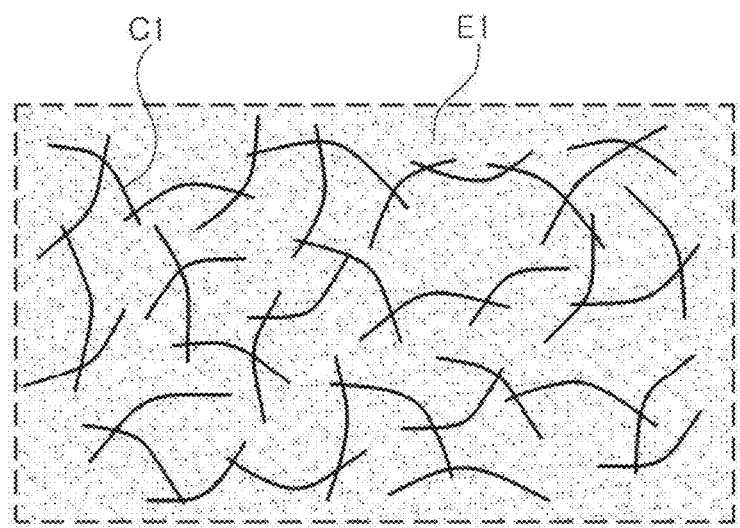
Figure 4A:
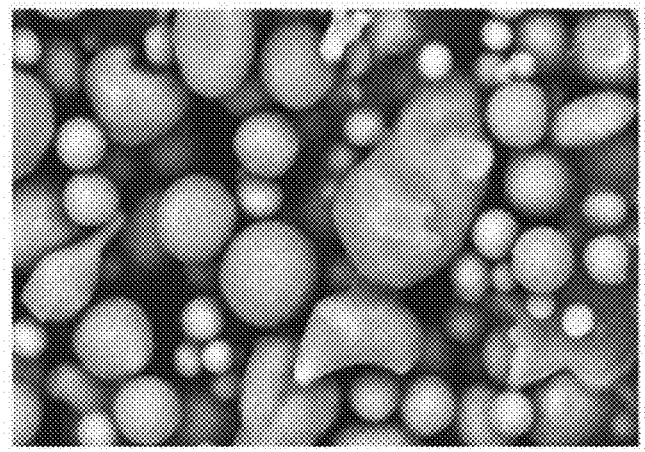
FIGS. 4A and 4B are, respectively, a scanning electron microscope (SEM) photograph and a schematic view illustrating a second electrode protection layer that may be used in the chip resistor element according to an exemplary embodiment.
Figure 4B:
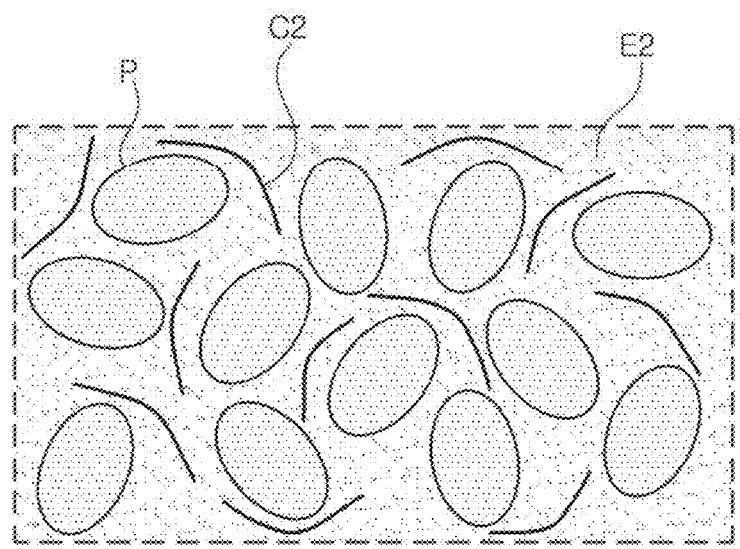

FIGS. 3A and 4A are scanning electron microscope (SEM) photographs obtained by capturing images of examples of the first and second electrode protection layers 17a and 17b, respectively, and FIGS. 3B and 4B are schematic views illustrating internal configurations of the first and second electrode protection layers 17a and 17b, respectively.

First, referring to FIGS. 3A and 3B, the first electrode protection layer 17a may contain a resin E1 containing carbon nanotubes C1 as first conductive powder particles. For example, the resin E1 of the first electrode protection layer 17a may be an epoxy resin, a silicon resin, or a combination thereof.

The carbon nanotubes C1 are used, whereby a content of the resin may be increased and desired conductivity may be easily secured. A content of the resin E1 in the first electrode protection layer 17a may be in a range of 95 to 99 wt % of a total weight of the first electrode protection layer 17a, but is not limited thereto. A content of the carbon nanotubes C1 may be 1 to 5 wt % of the total weight of the first electrode protection layer 17a. The first electrode protection layer 17a may be formed by preparing a paste for the first electrode protection layer 17a and then printing the paste. In consideration of workability, a length of the carbon nanotube may be in a range of 5 μm to 20 μm and/or a diameter of the carbon nanotube may be in a range of 3 nm to 20 nm.

Referring to FIGS. 4A and 4B, the second electrode protection layer 17b may contain a resin E2 containing copper-nickel (CuNi) alloy powder particles P as second conductive powder particles. For example, the resin E2 of the second electrode protection layer 17b may be an epoxy resin, a silicon resin, or a combination thereof. The resin E2 of the second electrode protection layer 17b may be the same as the resin E1 of the first electrode protection layer 17a.

CuNi alloy powder particles P may be contained in a content of 90 to 97 wt % in order to secure sufficient plating properties. A content of the resin E2 in the second electrode protection layer 17b may be as low as possible as long as the CuNi alloy powder particles P may be bonded to each other and the second electrode protection layer 17b may be bonded to the first electrode protection layer 17a. For example, a content of the resin E2 in the second electrode protection layer 17b may be in a range of 3 to 10 wt %. An average particle size (d50) of the CuNi alloy powder particles P may be in a range of 2 μm to 30 μm in order for the CuNi alloy powder particles P to be exposed to a surface to improve plating properties. This preferable particle size condition may be similarly applied to conductive powder particles other than the CuNi alloy powder particles.

The CuNi alloy powder particles P have excellent sulfuration resistance characteristics to thereby be stable, but have conductivity slightly lower than that of a metal such as Ag. In order to make up for this disadvantage, a weight ratio of Ni in the CuNi alloy powder particles may be adjusted to be 20 wt % or more, more preferably 50 wt % or more, to increase conductivity of the CuNi alloy powder particles. In addition, in the present exemplary embodiment, a small amount of carbon nanotubes C2 may be additionally contained in the second electrode protection layer 17B. For example, a content of the carbon nanotubes C2 may be 1 to 5 wt % of a total weight of the second electrode protection layer 17b. This will be described in detail with reference to FIGS. 9 and 10.

The first and second electrode protection layers 17a and 17b that may be used in the present exemplary embodiment may have a combination of various components. The first and second conductive powder particles may include other conductive powder particles having better chemical stability than that of Ag, in addition to the carbon nanotubes or the CuNi alloy powder particles. For example, the first and second conductive powder particles may include another Cu-based or Ni-based alloy, a Pd-based alloy such as AgPd, or the like. The first and second conductive powder particles may be formed of different materials or different combinations, as described above. Alternatively, the first and second conductive powder particles may be formed of the same material and satisfy desired conditions of the first and second electrode protection layers 17a and 17b by adjusting other conditions (particle sizes or contents). This will be described in detail with reference to FIG. 6.

The resin of the first electrode protection layer 17a may be the same as the resin of the second electrode protection layer 17b, but is not limited thereto. The second resistor protection layer 16b may contain the same resin as that of the first electrode protection layer 17a. For example, all of the resins of the first and second electrode protection layers 17a and 17b and the resin of the second resistor protection layer 16b may be an epoxy resin.

Figure 5:
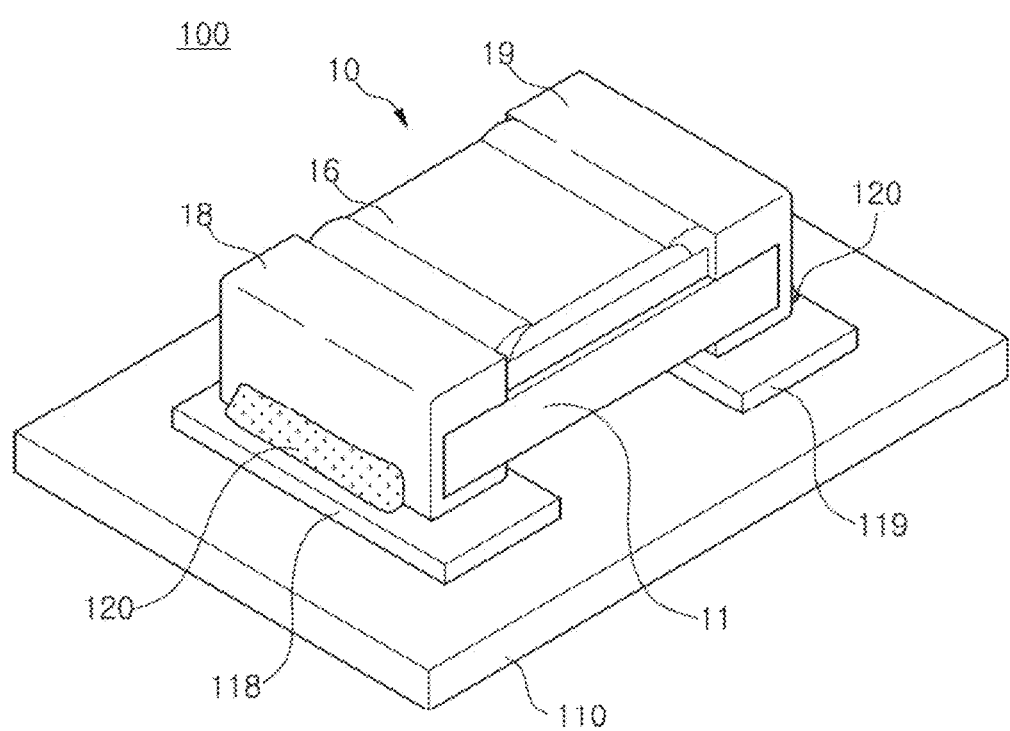
FIG. 5 is a perspective view illustrating a resistor element assembly in which the chip resistor element illustrated in FIG. 1 is mounted on a mounting substrate.

FIG. 5 is a perspective view illustrating a resistor element assembly in which the chip resistor element illustrated in FIG. 1 is mounted on a mounting substrate.

Referring to FIG. 5, a resistor element assembly 100 according to the present exemplary embodiment may include the chip resistor element 10 illustrated in FIG. 1 and a circuit board 110 on which the chip resistor element 10 is mounted.

The circuit board 110 may include first and second electrode pads 118 and 1 19 formed in a region in which an element will be mounted. The first and second electrode pads 118 and 1 19 may be land patterns connected to circuit patterns provided on or in the circuit board 110. The first and second electrode pads 118 and 119 are provided in order to mount the element. The first and second external electrodes 18 and 19 may respectively be connected to the first and second electrode pads 118 and 119 by solders 120.

As illustrated in FIG. 5, the chip resistor element 10 may be mounted on the circuit board 110 so that a surface thereof (denoted by the resistor protection layer 16 in FIG. 5) on which the resistor layer 15 is formed is directed toward the top (e.g., such that the surface of the substrate 11 on which the resistor layer 15 is provided faces away from the circuit board 110). In this case, the internal electrodes of the chip resistor element 10 are easily exposed to external air, such that the internal electrodes are easily sulfurized. However, as described above, permeation of materials from the outside may be blocked by high adhesion of the first electrode protection layer 17a in which a content of resin is high, and plating properties for ensuring reliable electrical contact with the external electrodes 18 and 19 may be ensured by the second electrode protection layer 17b. Therefore, a chip resistor element and a resistor element assembly having excellent sulfuration resistance characteristics may be provided.

Figure 6:
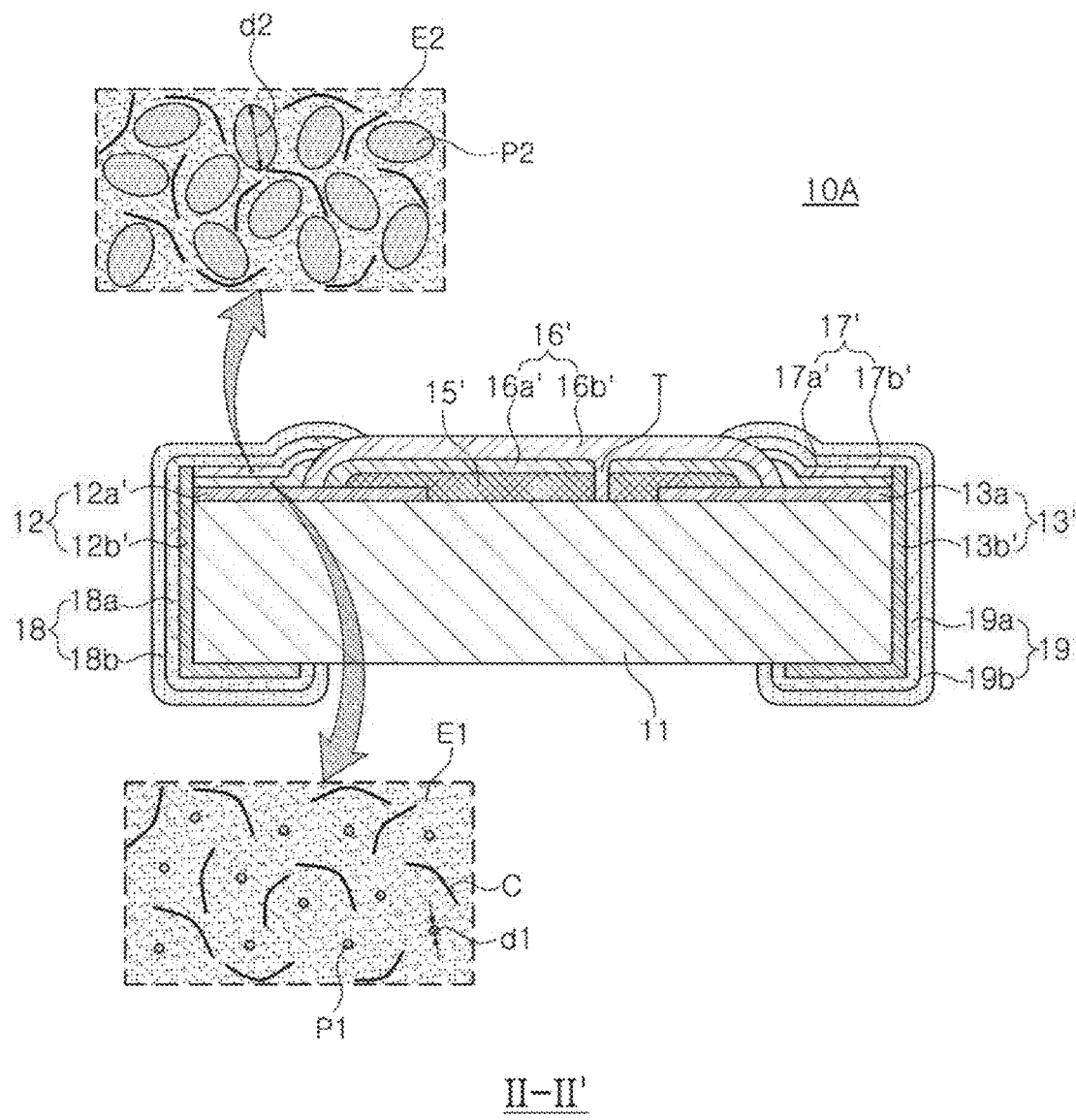
FIG. 6 is a side cross-sectional view illustrating a chip resistor element according to an exemplary embodiment.

FIG. 6 is a side cross-sectional view illustrating a chip resistor element according to an exemplary embodiment.

It may be understood that a chip resistor element 10A illustrated in FIG. 6 is similar to the chip resistor element 10 illustrated in FIGS. 1 and 2 except that configurations of electrode protection layers 17' are modified depending on whether or not to apply a trimming process. Additionally, a method of forming an internal electrode 12' is modified. The function and position of components of the present exemplary embodiment may be understood with reference to a description for the same or similar components of the chip resistor element 10 illustrated in FIGS. 1 and 2 unless explicitly described to the contrary.

The electrode protection layers 17' may include first and second electrode protection layers 17a' and 17b' in which contents of resins are different from each other. The first electrode protection layer 17a' may contain first conductive powder particles in a first weight ratio, and the second electrode protection layer 17b' may contain second conductive powder particles in a second weight ratio greater than the first weight ratio.

In the present exemplary embodiment, both of the first conductive powder particles and the second conductive powder particles may include alloy powder particles P1 and P2 such as CuNi alloy powder particles. The alloy powder P2 of the second electrode protection layer 17b' may have a particle size d2 larger than a particle size d1 of the alloy powder of the first electrode protection layer 17a'. The first and second electrode protection layers 17a' and 17b' may further contain carbon nanotubes C in order to secure conductivity.

A content of the resin E1 in the first electrode protection layer 17a' may be in a range of 95 to 99 wt % of a total weight of the first electrode protection layer 17a', and a content of the resin E2 in the second electrode protection layer 17b' may be in a range of 3 to 10 wt % of a total weight of the second electrode protection layer 17b'. However, contents of the resins in the first and second electrode protection layers 17a' and 17b' are not limited thereto.

As described above, the first and second conductive powder particles may be implemented by various combinations, and may selectively enhance desired characteristics (close adhesion properties, plating properties, and conductivity) based on their contents, particle sizes, and/or a combination with another powder (for example, carbon nanotubes).

The resins E1 and E2 of the first and second electrode protection layers 17a' and 17b' may be an epoxy resin, a silicon resin, or a combination thereof. The resin E2 of the second electrode protection layer 17b' may be the same as the resin E1 of the first electrode protection layer 17a'.

First and second internal electrodes 12' and 13' used in the present exemplary embodiment may be formed by a process different from a process used in the exemplary embodiment described above. Upper electrodes 12a and 13a of the first and second internal electrodes 12' and 13' may be disposed on the first surface of the insulating substrate 11 so as to be connected to a resistor layer 15', similar to the exemplary embodiment described above. Side electrodes 12b' and 13b' may be provided on side surfaces of the first and second electrode protection layers 17a' and 17b' as well as on side surfaces of the insulating substrate 11. Here, the side electrodes 12b' and 13b' are formed after the first and second electrode protection layers 17a' and 17b' are formed. However, the side electrodes 12b' and 13b' are not limited thereto, and may further be extended to a second surface of the insulating substrate 11 opposing the first surface of the insulating substrate 11, as illustrated in FIG. 6.

The resistor layer 15' may include a partially removed portion T. The partially removed portion T may be a result obtained by performing trimming in order to precisely tune a resistance value of the resistor layer 15'. Here, "trimming" refers to a partial removal process such as a fine cutting process, or the like, performed in order to obtain a particular resistance value required for designing a circuit after forming the resistor layer 15'.

Figure 7:
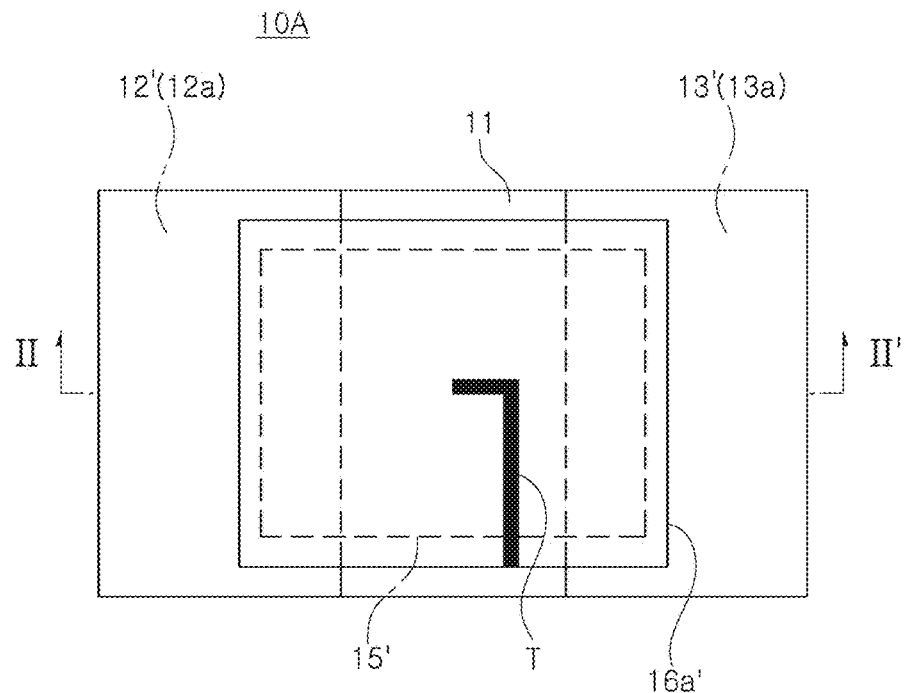
FIG. 7 is a plan view illustrating the chip resistor element of FIG. 6.

As illustrated in FIG. 7, a trimming process for obtaining a desired resistance value may be performed after the first resistor protection layer 16a' is formed on the resistor layer 15'. The first resistor protection layer 16a' may contain a glass-based material, and prevent damage generated in an undesired region due to a laser beam, or the like, used in the trimming process. In the trimming process, the resistor layer 15' and the first resistor protection layer 16a' may be partially removed as illustrated in FIG. 7, such that the chip resistor element may have a desired resistance value. Then, the second resistor protection layer 16b' may be disposed on the first resistor protection layer 16a', and may cover and protect the resistor layer 15' exposed in the trimming process. The second resistor protection layer 16b' may also extend into and protect the partially removed portion T. The second resistor protection layer 16b' may contain a resin, which is a polymer. The second resistor protection layer 16b' may contain the same resin as the resin E of the first electrode protection layer 17a'.

Tests to be described below were performed in order to confirm an action and an effect depending on specific exemplary embodiments.

INVENTIVE EXAMPLE 1

First and second electrode protection layers (e.g., 17a and 17b) were manufactured in a chip resistor element similar to the chip resistor element illustrated in FIG. 1 depending on a condition of the present disclosure.

First, upper electrodes (e.g., 12a and 13a) were formed using a paste containing Ag as a main component. The first electrode protection layer (e.g., 17a) was formed using a paste in which carbon nanotubes and an epoxy resin were mixed with each other in a weight ratio of 3:97. As the carbon nanotubes, a product having a diameter of about 8 nm and a length of 10 μm to 15 μm was used. The second electrode protection layer (e.g., 17b) was formed on the first electrode protection layer (e.g., 17a) using a paste in which a CuNi alloy (Ni: 70 wt %), carbon nanotubes, and an epoxy resin were mixed with each other in a ratio of 94:1:5. Then, external electrodes (e.g., 18, 19) were formed by continuously performing Ni plating and Sn plating.

Comparative Example

A chip resistor element was manufactured by the same method as a method according to Inventive Example 1, and external electrodes were formed by continuously performing Ni plating and Sn plating without forming first and second electrode protection layers (e.g., 17a and 17b).

Sulfuration Resistance Characteristic Evaluation Test (FoS)

An FoS test suggested by IBM Corporation is performed on chip resistor elements manufactured according to the Inventive Example 1 and the Comparative Example. In detail, a glass desiccator was inserted into an oven maintained at a temperature of 105° C., the chip resistor elements manufactured according to Inventive Example 1 and the Comparative Example were injected together with predetermined solid sulfur (S8) into the oven, and a change of resistivity from an initial resistance value was measured with the passage of time. The change of the resistivity, which is used as a test result, is illustrated in the graph shown in FIG. 8.

Figure 8:
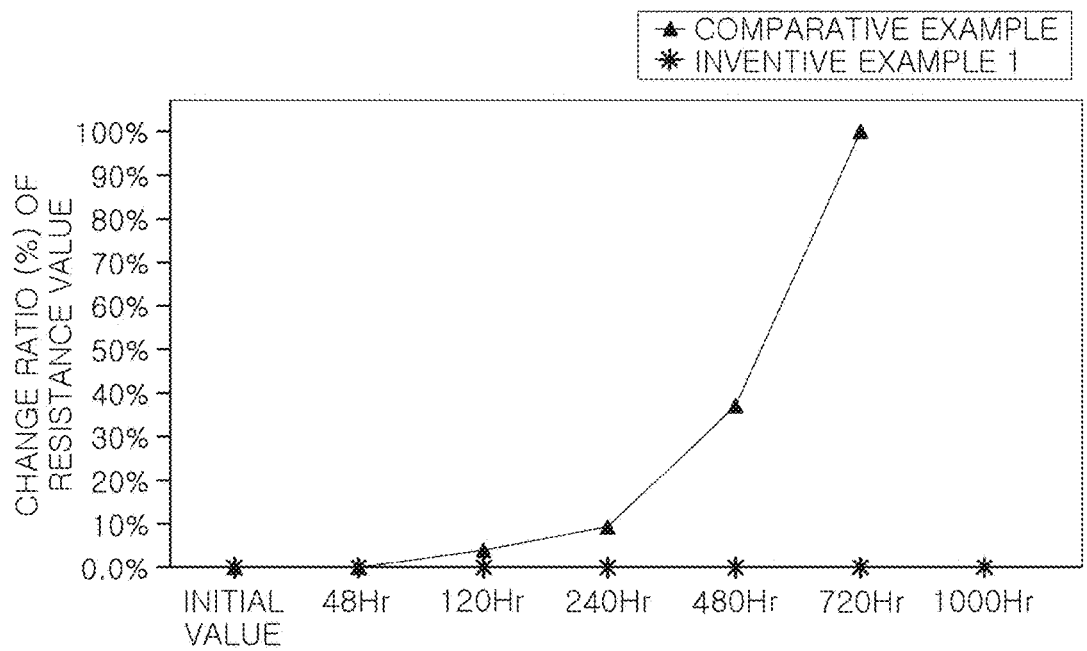
FIG. 8 is a graph comparing sulfuration resistance characteristics of chip resistor elements according to Inventive Example 1 and a Comparative Example.

Referring to FIG. 8, in the chip resistor element according to the Comparative Example, a change ratio of a resistance value after 120 hours was 30% or more. That is, a serious defect occurred in the chip resistor element manufactured according to the Comparative Example. On the other hand, in the chip resistor element manufactured according to Inventive Example 1, a change ratio of a resistance value was 0.5% or less after 1000 hours. That is, the chip resistor element manufactured according to Inventive Example 1 exhibited excellent stability.

Plating Properties Test

Additionally, an evaluation of Ni plating properties in response to variations in a content of epoxy resin was performed. As an evaluation method, five samples (A, B, C, D, and E) were prepared by mixing a CuNi alloy (Ni: 70 wt %) and an epoxy resin with each other, and a content of epoxy resin was changed (3 wt %, 5 wt %, 6 wt %, 8 wt %, and 10 wt %) such that a different content of epoxy resin was used in each sample. Ni plating layers were formed on surfaces of the respective samples under the same conditions, resistance values of the Ni plating layers were measured, and close adhesion properties were evaluated by a tape test.

TABLE 1

| Sample | A | B | C | D | E |
|---|---|---|---|---|---|
| Content (wt %) of Epoxy Resin | 3 | 5 | 6 | 8 | 10 |
| Resistance Value (KΩ) | 5.0 | 6.7 | 7.0 | 10.4 | 67.3 |
| Tape Test | Good | Good | Good | Good | Unsatisfactory |
| Evaluation for Plating Property | Very Good | Very Good | Very Good | Good | Unsatisfactory |

As illustrated in Table 1, it was confirmed that in a case in which a content of epoxy resin is 8 wt % or less, plating properties are good or very good, and particularly, in a case in which a content of epoxy resin equals or exceeds 10 wt %, a plating layer of unsatisfactory quality is formed and is easily delaminated.

Inventive Example 2

Evaluation of CuNi Alloy

An evaluation for a CuNi alloy that may be usefully adopted in the present exemplary embodiment was performed. Sulfuration resistance characteristics and specific resistance values of alloy powder particles for the respective samples were measured while changing a ratio between Cu and Ni (a content of Ni: 0 wt %, 20 wt %, 45 wt %, 80 wt %, 100 wt %). An electrode protection layer (e.g., 17) was manufactured by mixing 90 wt % of alloy powder particles having compositions depending on the condition described above with 10 wt % of epoxy resin. The electrode protection layer manufactured in the present experiment may be a second electrode protection layer (e.g., 17b).

First, an FoS test depending on an alloy ratio was performed on the respective samples. The FoS test was performed by the same method as the method described above. Additionally, changes of specific resistance values of the respective samples depending on an amount of added carbon nanotubes were also measured.

Figure 9:
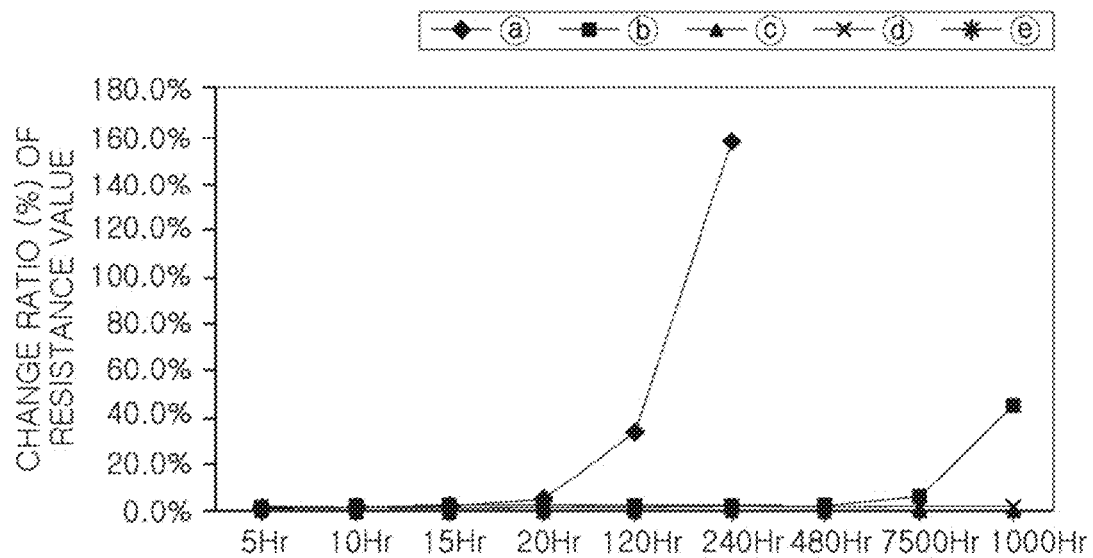
FIG. 9 is a graph comparing sulfuration resistance characteristics of chip resistor elements according to Inventive Example 2 (a change of an alloy ratio)
Figure 10:
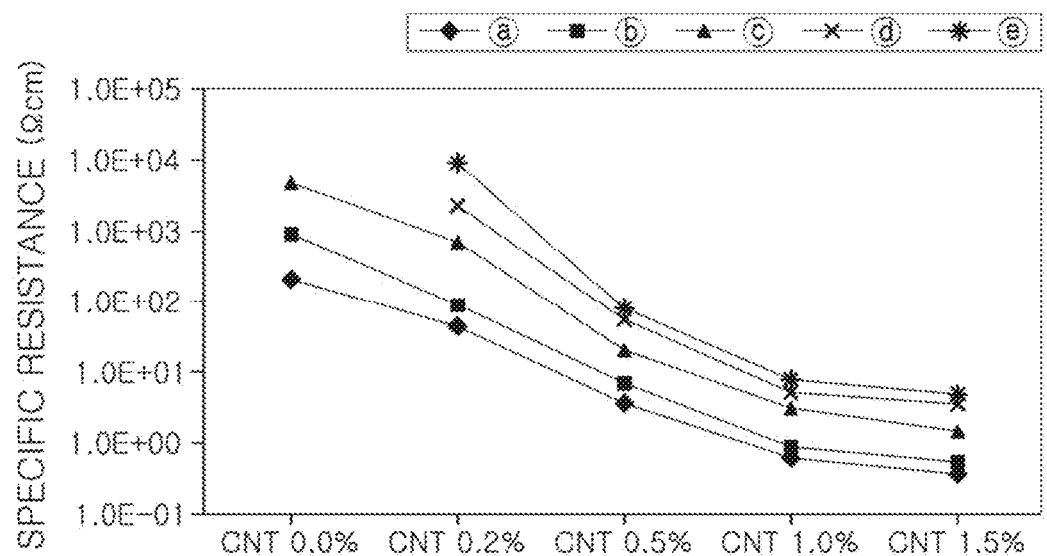
FIG. 10 is a graph comparing sulfuration resistance characteristics of chip resistor elements according to Inventive Example 2 (a change of an amount of added carbon nanotubes)

Measurement results are shown by graphs of FIGS. 9 and 10 together with Table 2. In Table 2, maximum times in which change ratios of specific resistance values are maintained to be ±1% or less were shown as an FoS evaluation result.

nanotubes, such that a specific resistance of the CuNi alloy powder particles may be significantly decreased. If necessary, an amount of added carbon nanotubes may be adjusted to 1.5 wt % or less, more preferably, 1.0 wt % or less for the purpose of workability of a paste.

A structure of a multilayer electrode protection layer (e.g., 17) used in the chip resistor element according to the present exemplary embodiment may also be usefully applied to various types of chip resistor elements. For example, the structure of the multilayer electrode protection layer may be usefully applied to a multi-terminal (for example, three-terminal) chip resistor element as well as an array type chip resistor element.

Figure 11:
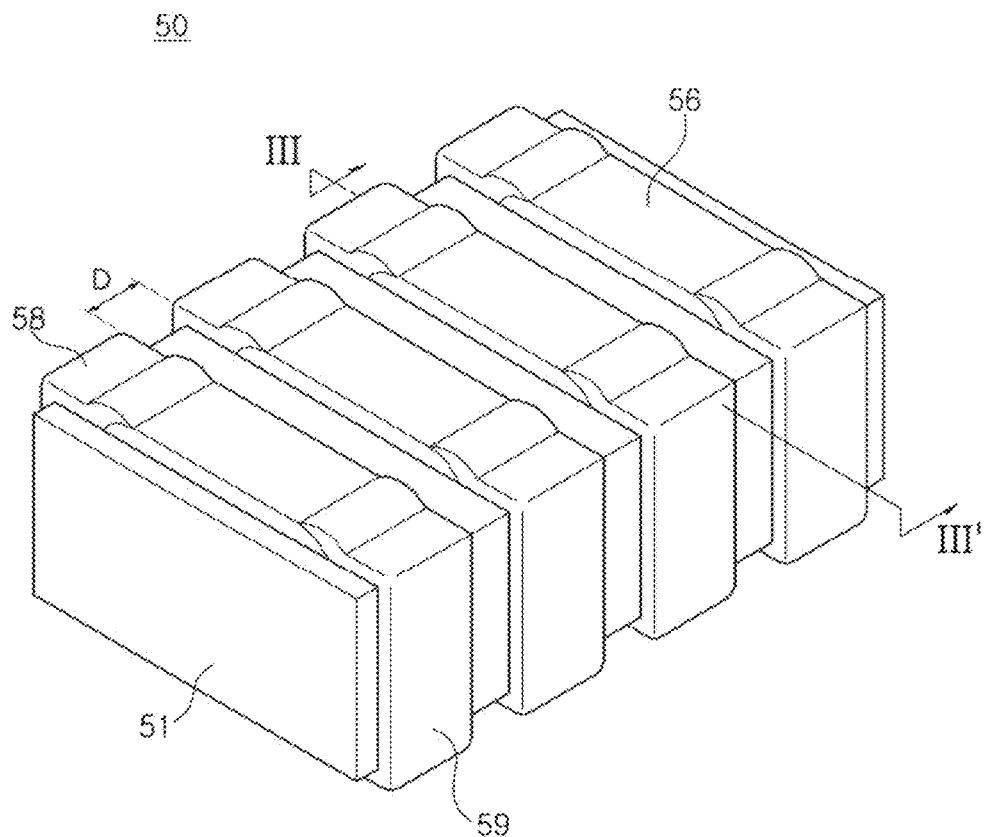
FIG. 11 is a perspective view illustrating a chip resistor element according to an exemplary embodiment.
Figure 12:
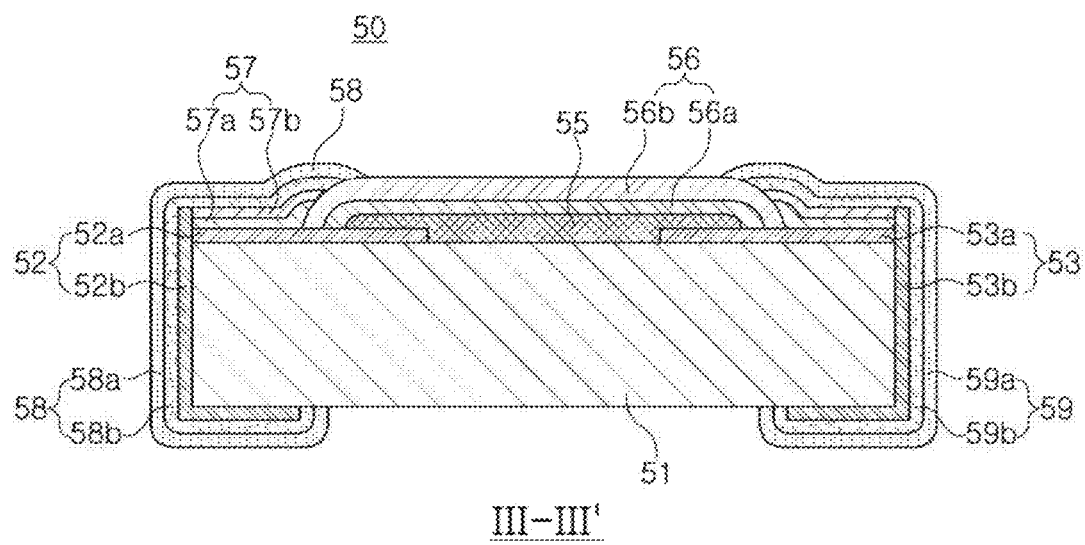
FIG. 12 is a side cross-sectional view illustrating the chip resistor element of FIG. 11.

FIG. 11 is a perspective view illustrating a chip resistor element (an array type chip resistor element) according to an exemplary embodiment; and FIG. 12 is a side cross-sectional view illustrating the chip resistor element of FIG. 11.

Referring to FIG. 11, a chip resistor element 50 according to the present exemplary embodiment may include an insulating substrate 51 on which five resistor parts are arranged to be spaced apart from each other by a predetermined spacing distance (D).

Each resistor part of the chip resistor element 50 may include a resistor layer 55, first and second internal electrodes 52 and 53, first and second external electrodes 58 and 59, a resistor protection layer 56, and electrode protection layers 57, as illustrated in FIG. 12. Components of the present exemplary embodiment may be understood with reference to a description of similar components of the chip resistor element 10A illustrated in FIG. 6 unless explicitly described to the contrary.

TABLE 2

| Sample No. | Alloy Ratio (wt %) Cu | Alloy Ratio (wt %) Ni | FoS Maximum Maintenance Time (ỏ ± 1%) (in Hr) | Change of Specific Resistance (Ω cm) depending on an amount of added carbon nanotubes | | | | |
|---|---|---|---|---|---|---|---|---|
| | | | | 0 wt % | 0.2 wt % | 0.5 wt % | 1.0 wt % | 1.5 wt % |
| a | 100 | 0 | 15 | $2 \times 10^2$ | $4 \times 10$ | $3 \times 10^0$ | $6 \times 10^{-1}$ | $3 \times 10^{-1}$ |
| b | 80 | 20 | 480 | $9 \times 10^2$ | $8 \times 10$ | $6 \times 10^0$ | $8 \times 10^{-1}$ | $5 \times 10^{-1}$ |
| c | 55 | 45 | 1000⁻ | $5 \times 10^3$ | $7 \times 10^2$ | $2 \times 10$ | $3 \times 10^0$ | $1 \times 10^0$ |
| d | 20 | 80 | 1000⁻ | open | $2 \times 10^2$ | $5 \times 10$ | $5 \times 10^0$ | $3 \times 10^0$ |
| e | 0 | 100 | 1000⁻ | open | $9 \times 10^3$ | $8 \times 10$ | $7 \times 10^0$ | $4 \times 10^0$ |

Referring to Table 2 and FIG. 9, an FoS maximum maintenance time was only 15 hours in sample a, was increased in samples in which nickel is contained, and was 1000 hours or more in cases in which a content of nickel was 45 wt % or more. That is, it may be confirmed that sulfuration resistance characteristics are enhanced in a case in which a content of nickel is increased.

In terms of the sulfuration resistance characteristics as described above, a weight ratio of Ni in the CuNi alloy may be 20 wt % or more, more preferably, 45 wt % or 50 wt % or more. However, when a weight ratio of Ni is increased, a specific resistance is increased. Therefore, in a case of a CuNi alloy in which a weight ratio of Ni is high, carbon nanotubes may be appropriately mixed with the CuNi alloy in order to reduce the specific resistance value.

Referring to Table 2 and FIG. 10, it might be confirmed that an amount of added carbon nanotubes is increased to significantly decrease an entire specific resistance of the CuNi alloy. Particularly, CuNi alloy powder particles in which a weight ratio of nickel is 80 wt % or more (e.g., samples d and e) may also be mixed with the carbon Five resistor layers 55 may be disposed to be spaced apart by the predetermined spacing distance on an upper surface (or a first surface) of the insulating substrate 51. The first and second internal electrodes 52 and 53 may be disposed on both side surfaces of the insulating substrate 51. The first and second internal electrodes 52 and 53 may be connected to the resistor layer 55, and may include upper electrodes 52a and 53a disposed on the upper surface of the insulating substrate 51 and side electrodes 52b and 53b disposed on respective side surfaces of the insulating substrate 51. As illustrated in FIG. 12, the side electrodes 52b and 53b may extend to a second surface of the insulating substrate 51 opposing the first surface of the insulating substrate 51.

The resistor protection layer 56 may be disposed to cover the resistor layer 55, and may include a first resistor protection layer 56a and a second resistor protection layer 56b. The first resistor protection layer 56a may be formed before a trimming process, and the second resistor protection layer 56b may be formed after the trimming process.

The electrode protection layers 57 may be respectively disposed on the first and second internal electrodes 52 and 53 so as to be overlapped with portions of the resistor protection layer 56. The electrode protection layers 57 may include first electrode protection layers 57a disposed on the upper electrodes 52a and 53a and second electrode protection layers 57b disposed on the first electrode protection layers 57a. The first and second electrode protection layers 57a and 57b may be formed of resins containing first and second conductive powder particles, respectively, and a content of the resin in the second electrode protection layer 57b may be lower than that of the resin in the first electrode protection layer 57a.

Since a content of the resin in the first electrode protection layer 57a is relatively high (e.g., compared to the content of the resin in the second electrode protection layer 57b), adhesion between the first electrode protection layer 57a and the resistor protection layer 56 having a material similar to that of the first electrode protection layer 57a may be high. A content of the resin in the second electrode protection layer 57b may be relatively low (e.g., compared to the content of the resin in the first electrode protection layer 57a), and a content of conductive powder particles in the second electrode protection layer 57b may be high. Therefore, a plating process for the first and second external electrodes 58 and 59 that will be positioned on the second electrode protection layers 57b may be smoothly performed. As shown, each of the first and second external electrodes 58 and 59 may have two layers, and thus respectively include first and second external electrode layers 58a, 58b, and 59a, 59b.

As described above, the electrode protection layer 57 used in the present exemplary embodiment is divided into at least two layers, and contents of the resins (or contents of conductive powder particles) in the respective layers are different from each other, whereby different characteristics (for example, adhesion and plating properties) may be simultaneously provided by the electrode protection layer 57.

As set forth above, according to an exemplary embodiment, multilayer electrode protecting structures having contents of resins that are different from each other may be introduced to prevent delamination of the multilayer electrode protecting structures from a resistor protection layer disposed beneath the multilayer electrode protecting structures and to easily form a plating layer for external electrodes.

While exemplary embodiments have been shown and described above, it will be apparent to those skilled in the art that modifications and variations could be made without departing from the scope of the present invention as defined by the appended claims.

What is claimed is:
1. A chip resistor element comprising:
an insulating substrate having first and second surfaces opposing each other;
a resistor layer disposed on the first surface of the insulating substrate;
first and second internal electrodes disposed on respective sides of the resistor layer on the first surface of the insulating substrate and connected to the resistor layer;
a resistor protection layer covering the resistor layer and extending onto portions of the first and second internal electrodes;
first electrode protection layers disposed on the first and second internal electrodes so as to be overlapped with portions of the resistor protection layer and containing first conductive powder particles and a resin;
second electrode protection layers disposed on the first electrode protection layers and containing second conductive powder particles and a resin, wherein a content of the resin in the second electrode protection layer is lower than a content of the resin in the first electrode protection layer; and
first and second external electrodes respectively disposed on the first and second internal electrodes so as to cover the second electrode protection layers, and connected to the resistor protection layer.

2. The chip resistor element of claim 1, wherein the first electrode protection layers contain the first conductive powder particles in a first weight ratio, and
the second electrode protection layers contain the second conductive powder particles in a second weight ratio greater than the first weight ratio.

3. The chip resistor element of claim 1, wherein the second conductive powder has an average particle size (d50) larger than an average particle size (d50) of the first conductive powder.

4. The chip resistor element of claim 1, wherein the content of the resin in the first electrode protection layer is in a range of 95 to 99 wt % of a total weight of the first electrode protection layer.

5. The chip resistor element of claim 4, wherein the first conductive powder particles include 1 to 5 wt % of carbon nanotubes.

6. The chip resistor element of claim 5, wherein the carbon nanotubes have lengths of 5 μm to 20 μm and diameters of 3 nm to 20 nm.

7. The chip resistor element of claim 1, wherein the content of the resin in the second electrode protection layer is in a range of 3 to 10 wt % of a total weight of the second electrode protection layer.

8. The chip resistor element of claim 7, wherein the second conductive powder particles include 90 to 97 wt % of CuNi alloy powder particles.

9. The chip resistor element of claim 8, wherein an average particle size (d50) of the CuNi alloy powder particles is in a range of 2 μm to 30 μm.

10. The chip resistor element of claim 8, wherein a weight ratio of Ni in the CuNi alloy powder particles is 50 wt % or more.

11. The chip resistor element of claim 8, wherein the second conductive powder particles further include carbon nanotubes.

12. The chip resistor element of claim 1, wherein the first and second internal electrodes contain silver (Ag).

13. The chip resistor element of claim 1, wherein the resin of the first electrode protection layer is the same as the resin of the second electrode protection layer.

14. The chip resistor element of claim 1, wherein the resistor protection layer contains the same resin as the resin of the first electrode protection layer.

15. The chip resistor element of claim 1, wherein the resistor protection layer includes a first resistor protection layer disposed on the resistor layer and containing glass and a second resistor protection layer disposed on the first resistor protection layer and containing a resin.

16. The chip resistor element of claim 1, wherein the first and second internal electrodes extend onto side surfaces of the insulating substrate.

17. The chip resistor element of claim 1, wherein each of the first and second external electrodes includes a first plating layer containing nickel (Ni) and a second plating layer disposed on the respective first plating layer and containing at least one of Sn and Pb.

18. A chip resistor element comprising:
an insulating substrate;
a resistor layer disposed on an upper surface of the insulating substrate;
first and second upper electrodes disposed on respective sides of the resistor layer on the upper surface of the insulating substrate and connected to the resistor layer;
a resistor protection layer covering the resistor layer and extending onto portions of the first and second upper electrodes;
first and second side electrodes disposed on respective side surfaces of the insulating substrate and respectively connected to the first and second upper electrodes;
first electrode protection layers disposed on the first and second upper electrodes so as to be overlapped on portions of the resistor protection layer and containing first conductive powder particles and a resin;
second electrode protection layers disposed on the first electrode protection layers and containing second conductive powder particles and a resin, wherein a content of the resin in the second electrode protection layer is lower than a content of the resin in the first electrode protection layer; and
first and second external electrodes respectively disposed on the first and second side electrodes and extended to cover the second electrode protection layers.

19. The chip resistor element of claim 18, wherein the first and second upper electrodes contain silver (Ag).

20. The chip resistor element of claim. 18, wherein the second conductive powder has an average particle size (d50) larger than an average particle size (d50) of the first conductive powder, and
the first electrode protection layer contains the first conductive powder particles in a first weight ratio, and the second electrode protection layer contains the second conductive powder particles in a second weight ratio greater than the first weight ratio.

21. The chip resistor element of claim 18, wherein the content of the resin in the first electrode protection layer is in a range of 95 to 99 wt % of a total weight of the first electrode protection layer, and the first conductive powder particles include 1 to 5 wt % of carbon nanotubes, and
the content of the resin in the second electrode protection layer is in a range of 3 to 10 wt % of a total weight of the second electrode protection layer, and the second conductive powder particles include 90 to 97 wt % of CuNi alloy powder particles.

22. The chip resistor element of claim 21, wherein the second conductive powder particles further include 0.2 to 0.5 wt % of carbon nanotubes.

23. A chip resistor element comprising:
a resistor layer;
an internal electrode contacting the resistor layer;
a resistor protection layer disposed on the resistor layer and contacting the internal electrode;
an electrode protection layer disposed on the internal electrode and contacting the resistor protection layer; and
an external electrode disposed on the electrode protection layer,
wherein the electrode protection layer comprises:
a first electrode protection layer disposed on the internal electrode and contacting the resistor protection layer, and
a second electrode protection layer disposed on the first electrode protection layer and having the external electrode disposed thereon, and
wherein the first and second electrode protection layers each include resin, and a content of resin in the first electrode protection layer is higher than a content of resin in the second electrode protection layer.

24. The chip resistor element of claim 23, wherein the first and second electrode protection layers include the same resin.

25. The chip resistor element of claim 23, wherein the content of resin in the first electrode protection layer is in a range of 95 to 99 wt % of a total weight of the first electrode protection layer, and the content of the resin in the second electrode protection layer is in a range of 3 to 10 wt % of a total weight of the second electrode protection layer 17b'.

26. The chip resistor element of claim 23, wherein the first and second electrode protection layers each include conductive powder particles, and an average particle size of the conductive powder particles of the first electrode protection layer is smaller than an average particle size of the conductive powder particles of the second electrode protection layer.

27. The chip resistor element of claim 23, wherein each of the first and second electrode protection layers includes carbon nanotubes.

28. The chip resistor element of claim 23, wherein the internal electrode comprises:
an upper electrode disposed on a same surface of an insulating substrate having the resistor layer thereon; and
a side electrode disposed on a side surface of the insulating substrate adjacent to the same surface of the insulating substrate and contacting the upper electrode.

29. The chip resistor element of claim 28, wherein a portion of the side electrode extending from the side surface of the insulating substrate contacts an end portion of the upper electrode and end portions of the first and second electrode protection layers.

30. The chip resistor element of claim 28, wherein the side electrode extends onto another surface of the insulating substrate opposite to the same surface of the insulating substrate having the resistor layer thereon.

31. The chip resistor element of claim 23, wherein the resistor layer is disposed on an insulating substrate, and the resistor layer includes a trimmed portion from which the resistor layer is removed.

32. The chip resistor element of claim 23, wherein the second electrode protection layer includes conductive powder particles including a same metal element as the external electrode disposed on the electrode protection layer.

33. The chip resistor element of claim 32, wherein the second electrode protection layer includes conductive powder particles including a CuNi alloy and the external electrode disposed on the electrode protection layer includes Ni.

34. The chip resistor element of claim 23, wherein the resin of the first electrode protection layer is the same as a resin of the resistor protection layer.

35. A chip resistor element comprising:
an insulating substrate; and
a plurality of resistor parts arranged to be spaced apart from each other by a spacing distance on the insulating substrate,
where each resistor part of the plurality of resistor parts includes:
a resistor layer disposed on one surface of the insulating substrate;

an internal electrode disposed on the one surface of the insulating substrate and contacting the resistor layer;

a resistor protection layer disposed on the resistor layer and contacting the internal electrode;

an electrode protection layer disposed on the internal electrode and contacting the resistor protection layer; and an external electrode disposed on the electrode protection layer, wherein the electrode protection layer of each resistor part comprises:

a first electrode protection layer disposed on the internal electrode and contacting the resistor protection layer, and a second electrode protection layer disposed on the first electrode protection layer to have the external electrode disposed thereon, and wherein the first and second electrode protection layers of each resistor part each include resin, and a content of resin in the first electrode protection layer is higher than a content of resin in the second electrode protection layer.

36. A method of forming a chip resistor element comprising:

forming, on one surface of an insulating substrate, first and second internal electrodes that are spaced apart from each other by a gap;

forming, on the one surface of the insulating substrate, a resistor layer extending across the gap between the first and second internal electrodes to contact the first and second internal electrodes;

forming a resistor protection layer covering the resistor layer;

forming electrode protection layers on the first and second internal electrodes to contact the resistor protection layer; and forming first and second external electrodes respectively on the first and second internal electrodes so as to cover the electrode protection layers and to contact the resistor protection layer, wherein the forming the electrode protection layers comprises:

forming first electrode protection layers on the first and second internal electrodes to contact the resistor protection layer, and forming second electrode protection layers on the first electrode protection layers and having the first and second external electrode disposed thereon, and wherein the first and second electrode protection layers are each formed to include resin, and a content of resin in the first electrode protection layer is higher than a content of resin in the second electrode protection layer.

37. The method of claim 36, further comprising:

following the forming of the resistor layer, trimming the resistor layer by removing a portion of the resistor layer to obtain a particular resistance value.

38. The method of claim 37, wherein the forming the resistor protection layer comprises:

forming a first resistor protection layer covering the resistor layer;

following the forming the first resistor protection layer, trimming the resistor layer by removing a portion of the resistor layer and the first resistor protection layer to obtain a particular resistance value; and following the trimming, forming a second resistor protection layer covering the first resistor protection layer and the trimmed resistor layer.

39. The method of claim 36, wherein the forming first and second external electrodes comprises forming the first and second external electrodes by plating on the first and second internal electrodes and the electrode protection layers.

* * * * *